United States Patent
Breu et al.

(10) Patent No.: US 7,218,529 B2
(45) Date of Patent: May 15, 2007

(54) CIRCUIT ARRANGEMENT WITH A PROGRAMMABLE MEMORY ELEMENT ON A CIRCUIT BOARD, WITH SECURITY AGAINST REPROGRAMMING

(75) Inventors: Gunther Breu, Nuremberg (DE); Hans-Joachim Diehm, Fuerth (DE); Wolfgang Gutbrod, Moehrendorf (DE); Friedhelm Heinke, Heroldsberg (DE); Mathias Kuhn, Eckental (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 455 days.

(21) Appl. No.: 10/359,819

(22) Filed: Feb. 7, 2003

(65) Prior Publication Data
US 2003/0151138 A1  Aug. 14, 2003

(30) Foreign Application Priority Data
Feb. 8, 2002 (DE) ................... 102 05 208

(51) Int. Cl.
*H05K 1/18* (2006.01)
(52) U.S. Cl. ................... 361/761; 361/760; 361/764
(58) Field of Classification Search ........ 361/760–763, 361/782–783; 174/52.1–52.4; 257/700–710, 257/778–780
See application file for complete search history.

(56) References Cited

U.S. PATENT DOCUMENTS

| 4,604,644 | A | * | 8/1986 | Beckham et al. ........... 257/737 |
| 5,824,571 | A | | 10/1998 | Rollender et al. |
| 5,909,056 | A | * | 6/1999 | Mertol ........................ 257/704 |
| 5,969,426 | A | * | 10/1999 | Baba et al. .................. 257/778 |
| 6,191,360 | B1 | * | 2/2001 | Tao et al. ................... 174/52.4 |
| 6,366,467 | B1 | * | 4/2002 | Patel et al. .................. 361/760 |
| 6,404,644 | B1 | * | 6/2002 | Ikefuji et al. ............... 361/737 |
| 6,448,665 | B1 | * | 9/2002 | Nakazawa et al. .......... 257/789 |
| 6,566,748 | B1 | * | 5/2003 | Shimizu et al. ............. 257/704 |

FOREIGN PATENT DOCUMENTS

| DE | 19681689 T1 | 11/1998 |
| DE | 19681689 C2 | 5/2001 |

* cited by examiner

Primary Examiner—Tuan Dinh
(74) Attorney, Agent, or Firm—W. F. Fasse; W. G. Fasse

(57) ABSTRACT

A circuit arrangement includes a programmable memory element mounted on a circuit board, with programming contacts of the memory element connected to conductor paths of the circuit board. Data and/or programming codes stored in the memory element determine the functions of the circuit arrangement. To prevent unauthorized reprogramming of the memory element, at least one programming contact of the memory element and each conductor path connected thereto are covered or enclosed, so it is impossible to electrically contact this programming contact or the associated conductor paths without destroying the circuit arrangement. The circuit board is adhesively bonded to a board carrier, with the memory element and conductor paths sandwiched or encased therebetween. The circuit arrangement may be an engine controller for a motor vehicle, with security against unauthorized reprogramming for altering the performance of the engine.

14 Claims, 2 Drawing Sheets

CIRCUIT ARRANGEMENT WITH A PROGRAMMABLE MEMORY ELEMENT ON A CIRCUIT BOARD, WITH SECURITY AGAINST REPROGRAMMING

PRIORITY CLAIM

This application is based on and claims the priority under 35 U.S.C. §119 of German Patent Application 102 05 208.5, filed on Feb. 8, 2002, the entire disclosure of which is incorporated herein by reference.

FIELD OF THE INVENTION

The invention relates to a circuit arrangement including a circuit board such as a printed circuit board, which has a programmable memory element mounted thereon.

BACKGROUND INFORMATION

Circuit arrangements with a programmable memory element are used in various fields of circuit and electronics technology, for carrying out particular functions in different applications. The particular functions in this context are determined by the data or programming codes stored in the respective programmable memory element or elements. Such programmable memory elements can be reprogrammed simply by storing different data or programming codes therein. Thereby, it is possible to alter or entirely replace the original data or programming codes, which have been stored in the programmable memory element by the manufacturer, for example. However, such a reprogramming of the memory element by changing the stored data or programming codes, especially by unauthorized persons, is often not desired.

One field of application in which such circuit arrangements with at least one programmable memory element are typically used is in the engine controller of a motor vehicle. The data and programming codes stored in the memory element are the basis of the control functions carried out by the engine controller. It has become known that the engine performance characteristics of a motor vehicle can be altered or specially "tuned" by reprogramming the memory element of the engine controller circuit, and a special automobile tuning after-market has developed in this regard. It is also possible to change the engine performance characteristics by so-called "chipping", i.e. by removing the original equipment memory element and replacing it with a differently programmed memory element. In any event, such specialty tuning of the engine controller circuit arrangement aims to enhance the engine performance with respect to the maximum torque or maximum horsepower or the power curve, for example, but often while detracting from or totally removing various safety related functions such as the maximum engine speed (r.p.m.) limiting, or fuel economy, or exhaust gas emissions, for example. Generally, these electronic tuning efforts require ready access to the programmable memory element or at least the conductor paths connected to the contacts of the memory element, for carrying out the reprogramming.

SUMMARY OF THE INVENTION

In view of the above, it is an object of the invention to provide a circuit arrangement with a programmable memory element, which achieves a high degree of security against unauthorized reprogramming of the memory element, i.e. against unauthorized changing of the programmed functions of the memory element. The invention further aims to avoid or overcome the disadvantages of the prior art, and to achieve additional advantages, as apparent from the present specification. The attainment of these objects is, however, not a required limitation of the invention.

The above objects have been achieved according to the invention in a circuit arrangement with a programmable memory element arranged on a circuit board, wherein at least one of the contacts of the memory element that is provided for programming the memory element, as well as each conductor path of the circuit board connected with this programming contact of the memory element, are arranged in a covered or enclosed manner, so that the programming contact and the conductor paths connected thereto cannot be electrically contacted without destroying the circuit board, the memory element, the conductor paths, or the entire circuit arrangement. Particularly, the programming contact and the conductor paths connected thereto are not accessible from the outside of the circuit arrangement and therefore cannot be electrically contacted without destroying the circuit arrangement as just mentioned.

Preferably, the circuit board is adhesively bonded to a circuit board carrier or substrate, whereby the memory element is arranged on the adhesive side of the circuit board, i.e. between the circuit board and the circuit board carrier. Advantageously, the conductor paths of the circuit board, by means of which the memory element is programmable, are also arranged on the adhesive side of the circuit board, or are located internally within the circuit board on an intermediate layer or plane of the circuit board. In this manner, the memory element as well as the electrical contacts and conductor paths by which the memory element can be programmed are sandwiched and enclosed between the circuit board and the circuit board carrier, and are essentially permanently adhesively bonded in this condition by the adhesive. The "essentially permanent" adhesively bonded condition of this sandwiched arrangement means that an attempt to separate the circuit board from the circuit board carrier in order to access the memory element and/or its programming contacts and/or the conductor paths connected to the programming contacts, will destroy at least one of the circuit board, the memory element, the circuit board carrier, the conductor paths, or the entire circuit arrangement.

Further preferably, the memory element itself is embodied and configured with its contacts on a surface of the memory element facing toward the circuit board. In this manner, once the contacts have been soldered to the corresponding conductor paths of the circuit board, the contacts of the memory element are no longer accessible because they are enclosed between the circuit board and the memory element.

In a further preferred feature of the invention, the circuit arrangement additionally includes a microcontroller or microprocessor for carrying out the programming of the memory element. The microcontroller or microprocessor has control contacts similarly connected to corresponding conductor paths of the circuit board, by which the microcontroller or microprocessor communicates with the memory element. Preferably, the contacts of the microcontroller or microprocessor, just as those of the memory element, are arranged in a covered or enclosed manner so that they are not externally accessible without destroying the circuit arrangement.

The circuit arrangement according to the invention is especially suitable for use as a control device in a motor vehicle, and particularly as the engine controller of a motor vehicle. In this context, the inventive circuit arrangement prevents the unauthorized tuning of the engine by reprogramming or replacing the memory element of the circuit arrangement. Advantageously, the invention achieves this object in a simple and economical manner.

BRIEF DESCRIPTION OF THE DRAWINGS

In order that the invention may be clearly understood, it will now be described in connection with example embodiments, with reference to the accompanying drawings, wherein.

DETAILED DESCRIPTION OF A PREFERRED EXAMPLE EMBODIMENT AND OF THE BEST MODE OF THE INVENTION

Figure 1:
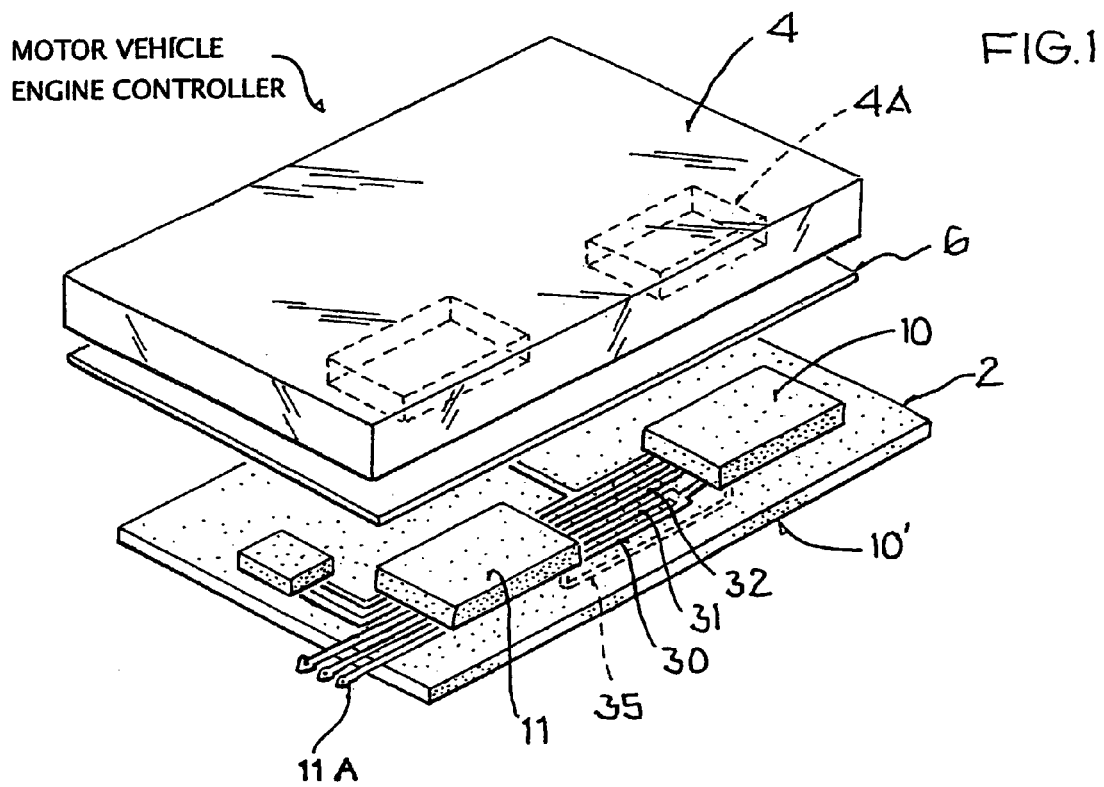
FIG. 1 is an exploded view of a circuit arrangement according to the invention, with a memory element arranged between a circuit board and a carrier.
Figure 3:
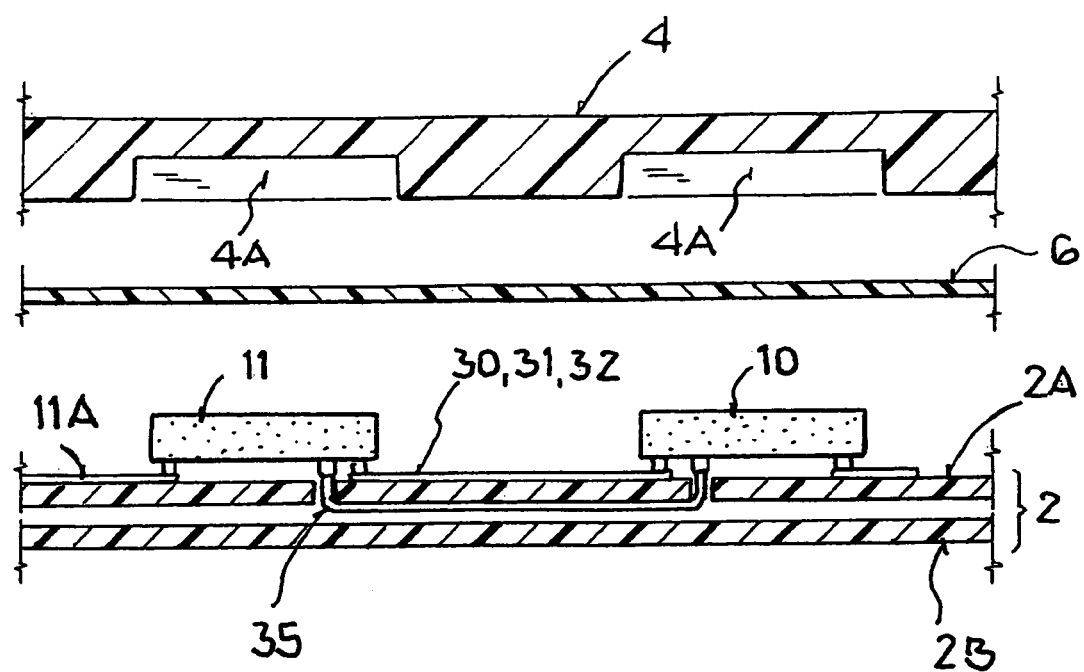
FIG. 3 is a schematic exploded sectional view of the circuit arrangement according to FIG. 1.

The circuit arrangement that is partially and schematically shown in an exploded manner in FIGS. 1 and 3 is used as an engine controller for controlling the engine of a motor vehicle. The circuit arrangement includes a circuit board 2 such as a printed circuit board 2, which may be provided with electronic components mounted on one or both opposite major surfaces thereof. The circuit arrangement further includes a circuit board carrier 4 that provides structural support for the circuit board 2. The circuit board 2 as well as the circuit board carrier 4 may each respectively have any conventionally known composition and construction. The electronic components mounted on the circuit board may similarly include any conventionally known electronic components arranged according to any conventionally known circuit technology.

Particularly according to the invention, at least one of the electronic circuit components is a programmable memory element 10, especially comprising a nonvolatile memory, e.g. a flash memory. The memory element 10 comprises plural contacts 10A, particularly including programming contacts 10A, through which data and/or programming codes can be written into and read from the memory locations of the memory element 10. Another one of the electronic circuit components is a microcontroller or microprocessor 11, which similarly has electrical contacts 11A. Conductor paths or traces 30, 31, 32 and 35 are provided on or in the circuit board 2, and are connected, e.g. soldered, to the respective contacts of the microprocessor 11 and of the memory element 10, to allow a communication therebetween, i.e. to allow the microprocessor 11 to read data and/or programming codes from, and to write data and/or programming codes to the memory element 10 via the respective contacts 11A and 10A and through the conductor paths 30, 31, 32 and 35.

The memory element 10, the conductor paths 30, 31 and 32 that are connected to the programming contacts of the memory element 10, and the microprocessor 11 are arranged on a surface of the circuit board 2 facing toward the circuit board carrier 4. After the components have been soldered onto the respective appropriate conductor paths on this surface of the circuit board 2, the circuit board carrier 4 is adhesively bonded onto the circuit board 2, for example by an adhesive 6 that can be applied in any conventionally known manner, either surfacially or just around a perimeter for example. Particularly, this mounting and adhesive bonding is carried out so that the memory element 10, the microprocessor 11, and the conductor paths 30, 31 and 32, via which the memory element 10 is programmable, are arranged or sandwiched between the circuit board 2 and the circuit board carrier 4, and are thereby enclosed and encased between these members which are adhesively bonded to each other by the adhesive 6. For this purpose, the circuit board carrier 4 has corresponding appropriate cavities or recesses 4A on a bottom surface thereof for receiving or accommodating the memory element 10 and the microprocessor 11 therein.

The adhesive bonding provided by the adhesive 6 between the circuit board 2 and the circuit board carrier 4 is secure, tight, and essentially permanent in such a manner, so that it becomes impossible to separate the circuit board 2 from the circuit board carrier 4 without destroying the circuit board 2, the circuit board carrier 4, the electronic circuit components, or the conductor paths provided thereon. Thus, after the adhesive bonding, the programming contacts of the memory element 10, as well as the conductor paths 30, 31 and 32 connected thereto, are no longer accessible, and can thus no longer be electrically contacted without destroying the circuit arrangement. Therefore, it is no longer possible, after the adhesive bonding step, to carry out a programming or reprogramming of the memory element 10 by directly contacting the programming contacts of the memory element 10, or by contacting the conductor paths 30, 31 and 32 to thereby electrically access the programming contacts of the memory element 10, or by contacting the enclosed contacts of the microprocessor 11 for thereby carrying out the reprogramming of the memory element 10.

Since the memory element 10 is no longer accessible for programming or reprogramming after it has been adhesively bonded and sandwiched between the circuit board 2 and the circuit board carrier 4 as described above, there are only two available options for programming the memory element 10. First, the memory element 10 may be loaded with the desired data and/or programming codes before the adhesive bonding step, i.e. while the programming contacts of the memory element 10 or at least the conductor paths 30, 31 and 32 are still accessible. Alternatively, the memory element 10 can be programmed by or through the microprocessor 11, whereby the microprocessor 11 preferably still has at least some external input contacts 11A exposed or accessible after the adhesive bonding step.

The microprocessor 11, however, is embodied with password protection and/or other security measures, to hinder or prevent an unauthorized manipulation of the microprocessor 11 and/or reprogramming of the memory element 10 through the operation of the microprocessor 11. On the other hand, an authorized person, such as the original manufacturer of the circuit arrangement, or the authorized installer or maintenance personnel for the engine controller of the motor vehicle, can reprogram the memory element 10 through the microprocessor 11 by using the proper password or other security measures to operate the microprocessor 11.

While the memory element 10 may be embodied or configured according to various conventionally known circuit component configurations, it is especially advantageous to configure the memory element 10 with a so-called ball grid array (BGA) housing or package, or a so-called chip scale package (CSP) configuration. This also applies to the microprocessor 11. With such circuit components having such configurations, the electrical contacts are on the bottom side of the component, i.e. the side facing the circuit board.

Therefore, after these components are mounted by soldering onto the circuit board, the contacts are no longer externally accessible.

Figure 2:
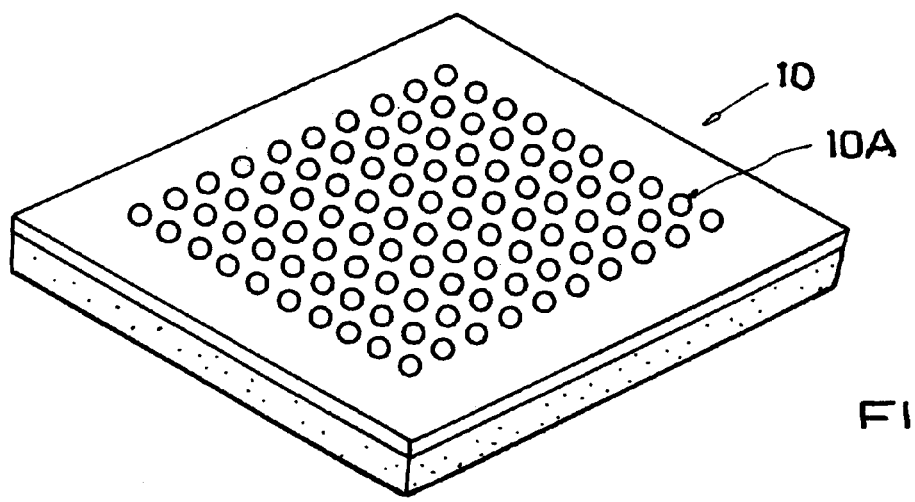
FIG. 2 is a schematic perspective view of the contacting surface of the memory element of the circuit arrangement according to FIG. 1.

FIG. 2 schematically shows a perspective view of a representative circuit component such as the memory element 10 with a BGA housing. Particularly, this memory element 10 comprises a plurality of contacts 10A arranged in a matrix pattern on its bottom surface. Small individual balls of a solder material are applied on the individual contacts 10A. Then, during the soldering process, these balls of solder material are melted and thereby establish individual solder connections of the individual contacts 10A to corresponding ones of the conductor paths of the circuit board by means of suitable contact surfaces or pads or tabs of the conductor paths.

If the memory element 10 is embodied as a component with a BGA housing or as a CSP component, then its contacts will be covered or enclosed after the memory element 10 is solder-mounted on the circuit board 2, so that these contacts are no longer accessible. In this case, the memory element 10 could be arranged on the surface of the circuit board 2 facing away from the circuit board carrier 4, as indicated schematically by the arrow 10' showing the alternative position of the memory element 10 in FIG. 1. With such an arrangement, the conductor paths 30, 31 and 32, through which the memory element 10 is programmable, are connected to the contacts 10A of the memory element 10 by means of suitable through-contacts. These through-contacts are to be provided under the memory element 10, so that these locations are not externally accessible. These same considerations also apply in the case when the microprocessor element 11 is embodied as a component with a BGA housing or as a CSP component.

However, with such an arrangement, it would still be possible for an unauthorized person to desolder the memory element 10, read out and alter the memory contents, then write the altered memory contents back into the memory element 10 or into a new different memory element, and then solder the reprogrammed memory element 10 or the new replacement memory element onto the circuit board 2. Such a procedure would entail a considerable effort and risk of destroying the conductor paths 30, 31 and 32 or other elements during the desoldering process, and therefore would be unlikely. Nonetheless, to provide a higher degree of security, the present invention recommends that the memory element 10 and the microprocessor 11 should be arranged on the adhesive side of the circuit board 2, i.e. the side of the circuit board 2 that is bonded by adhesive to the circuit board carrier 4, as shown in FIG. 1. With the preferred arrangement as shown in FIG. 1, it is no longer possible to access or alter the content of the memory element 10 without destroying the circuit arrangement.

It is not absolutely necessary that all of the conductor paths 30, 31 and 32 connected to the programming contacts of the memory element 10, i.e. the conductor paths through which a programming of the memory element 10 is possible, must be arranged and enclosed between the circuit board 2 and the circuit board carrier 4. Instead, it is sufficient if only some, or even only one, of these programming-related conductor paths 30, 31 and 32 are arranged in a covered or enclosed manner, because a rational reprogramming of the memory element 10 is already effectively prevented if only some or even only one of the contacts that are necessary for reprogramming the memory element 10 are no longer externally accessible without destroying the circuit arrangement.

As a further measure, as shown in FIGS. 1 and 3, the conductor paths 30, 31, 32 and 35 may include one or more embedded conductor paths 35 that are embedded within the circuit board 2, e.g. arranged on an interlayer within a multilayer laminated circuit board 2, e.g. between the layers 2A and 2B. Such an embedded conductor path 35 is even further protected against external access.

The measures described herein are only intended to prevent an unauthorized programming or reprogramming of the memory element 10. The manufacturer of the circuit arrangement and the installer of the circuit arrangement in the end use application (e.g. as an engine controller in an automobile) is, of course, authorized to program the memory element 10. Such authorized persons can program the memory element 10 in the normal manner during the manufacturing process at any stage before the circuit board 2 is adhesively bonded with the circuit board carrier 4. For example, this programming is carried out by electrically contacting the respective contacts 10A of the memory element 10 which are still freely accessible, or by contacting the corresponding associated conductor paths 30, 31, 32. As already mentioned above, after the adhesive bonding step, a programming of the memory element 10 is only possible via the microprocessor 11, for example via externally accessible input contact leads 11A. Such programming via the microprocessor 11 is only possible through the implementation of corresponding algorithms, whereby a password evaluation or other security measures are also carried out, in order to prevent an unauthorized reprogramming of the memory element 10.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A circuit arrangement comprising:
   a circuit board with conductor paths on or in said circuit board;
   a circuit board carrier and an adhesive that adhesively bonds said circuit board to said circuit board carrier, wherein a surface of said circuit board carrier facing said circuit board has a recess therein; and
   a programmable memory element that is mounted on said circuit board and is accommodated between said circuit board and said circuit board carrier in said recess of said circuit board carrier, and wherein said memory element has enclosed programming contacts through which said memory element is programmable;
   wherein said conductor paths include enclosed conductor paths connected to said enclosed programming contacts; and
   wherein said enclosed programming contacts and said enclosed conductor paths are arranged enclosed so as not to be electrically contactable or electrically conductively accessible from outside of said circuit arrangement without destroying at least any part of said circuit arrangement.

2. The circuit arrangement according to claim 1, wherein said enclosed programming contacts and said enclosed conductor paths connected thereto are arranged enclosed so as not to be electrically contactable without destroying at least one of said circuit board, said memory element, said conductor paths or said enclosed programming contacts.

3. The circuit arrangement according to claim 1, wherein said memory element is mounted on a surface of said circuit board that faces and is adhesively bonded to said circuit board carrier.

4. The circuit arrangement according to claim 1, wherein each one of said enclosed conductor paths is arranged on a surface of said circuit board that faces and is adhesively banded to said circuit board carrier.

5. The circuit arrangement according to claim 1, wherein at least one of said enclosed conductor paths is arranged on an intermediate layer within said circuit board.

6. The circuit arrangement according to claim 1, wherein said enclosed programming contacts are provided on a surface of said memory element facing toward and mounted on said circuit board, so that said enclosed programming contacts are inaccessible once said memory element is mounted on said circuit board.

7. The circuit arrangement according to claim 1, wherein said memory element comprises a non-volatile memory.

8. The circuit arrangement according to claim 1, further comprising a microprocessor or microcontroller that is mounted on said circuit board and that has at enclosed control contacts connected to at least some of said enclosed conductor paths, whereby said memory element is programmable by said microprocessor or microcontroller, wherein said enclosed control contacts are arranged enclosed so as not to be electrically contactable without destroying at least any part of said circuit arrangement.

9. The circuit arrangement according to claim 1, wherein said circuit arrangement is an engine controller of a motor vehicle, and said memory element has data pertaining to engine operating parameters stored therein.

10. The circuit arrangement according to claim 1,
    wherein said programmable memory element is mounted on a first surface of said circuit board;
    wherein said adhesive essentially permanently adhesively bonds said circuit board carrier onto said first surface of said circuit board, so that said memory element, said enclosed programming contacts and said enclosed conductor paths are located and enclosed between said circuit board and said circuit board carrier so as to be inaccessible from outside of said circuit arrangement without destroying at least one of said circuit board, said circuit board carrier, said enclosed conductor paths or said memory element.

11. The circuit arrangement according to claim 8, wherein said enclosed control contacts are provided on a surface of said microprocessor or microcontroller facing toward and mounted on said circuit board, so that said enclosed control contacts are inaccessible once said microprocessor or microcontroller is mounted on said circuit board.

12. The circuit arrangement according to claim 8, wherein said microprocessor or microcontroller further has external contacts that remain externally contactable.

13. The circuit arrangement according to claim 8, wherein said microprocessor or microcontroller is arranged between said circuit board and said circuit board carrier.

14. The circuit arrangement according to claim 10, further comprising a microprocessor or microcontroller that is mounted on said first surface of said circuit board and that has enclosed control contacts which are connected to said enclosed conductor paths and by which said microprocessor or microcontroller can program said memory element, wherein said microprocessor or microcontroller and said enclosed control contacts are located and enclosed between said circuit board and said circuit board carrier, so as to be inaccessible from outside of said circuit arrangement without destroying at least one of said circuit board, said circuit board carrier, said enclosed conductor paths, said memory element, or said microprocessor or microcontroller.

* * * * *

UNITED STATES PATENT AND TRADEMARK OFFICE
CERTIFICATE OF CORRECTION

PATENT NO. : 7,218,529 B2  Page 1 of 1
APPLICATION NO. : 10/359819
DATED : May 15, 2007
INVENTOR(S) : Breu et al.

It is certified that error appears in the above-identified patent and that said Letters Patent is hereby corrected as shown below:

<u>Title page</u>,
Item [56], Reference Cited, second column,
line 6, "6,404,644 B1 * 6/2002 Ikefuji et al. ..... 361/737" should be deleted;

<u>Column 7</u>,
Line 8, replace "banded", by --bonded--.

Signed and Sealed this

Third Day of June, 2008

JON W. DUDAS
*Director of the United States Patent and Trademark Office*